United States Patent
Czapka

(10) Patent No.: US 9,462,687 B2
(45) Date of Patent: Oct. 4, 2016

(54) GLASS COMPOSITE WITH FUNCTIONAL ELEMENT

(71) Applicant: Linda Czapka, Vienna (AT)

(72) Inventor: Linda Czapka, Vienna (AT)

( * ) Notice: Subject to any disclaimer, the term of this patent is extended or adjusted under 35 U.S.C. 154(b) by 21 days.

(21) Appl. No.: 14/389,816

(22) PCT Filed: Apr. 2, 2013

(86) PCT No.: PCT/AT2013/000054
§ 371 (c)(1),
(2) Date: Oct. 1, 2014

(87) PCT Pub. No.: WO2013/149274
PCT Pub. Date: Oct. 10, 2013

(65) Prior Publication Data
US 2015/0305148 A1 Oct. 22, 2015

(30) Foreign Application Priority Data

Apr. 2, 2012 (AT) .............................. A 50118/2012

(51) Int. Cl.
*H05K 1/03* (2006.01)
*B32B 17/06* (2006.01)
(Continued)

(52) U.S. Cl.
CPC ............. *H05K 1/0306* (2013.01); *B32B 17/06* (2013.01); *B32B 17/064* (2013.01); *F21V 29/50* (2015.01);
(Continued)

(58) Field of Classification Search
CPC ... H05K 1/0306; F21V 29/50; F21V 33/006; F21V 29/506; F21V 29/508; B32B 17/06; B32B 17/064; B32B 2457/00; B32B 2457/12; G02B 6/0076; F21Y 2105/001; H01L 31/0203; H01L 31/048; H01L 31/0481; H01L 31/0488; H01L 51/44; H01L 51/448; G09F 2013/049; G09F 2013/184; G09F 2013/1845; G09F 2013/1863; G09F 2013/225; G09F 2013/227; G09F 13/08; G09F 13/10
USPC .................................. 40/544, 570, 572, 577
See application file for complete search history.

(56) References Cited

U.S. PATENT DOCUMENTS

| | | | | |
|---|---|---|---|---|
| 4,645,970 A | * | 2/1987 | Murphy | ............ B32B 17/10036 313/509 |
| 6,559,451 B1 | * | 5/2003 | Izumi | ...................... H01L 27/12 250/370.01 |
| 7,431,628 B2 | * | 10/2008 | Park | ..................... H01L 51/5246 445/24 |

(Continued)

FOREIGN PATENT DOCUMENTS

| | | |
|---|---|---|
| CN | 201931665 | 8/2011 |
| DE | 10335979 A1 | 12/2004 |

(Continued)

OTHER PUBLICATIONS

ProQuest Dialog Patents, "Roof Element for Buildings", Christoph Doppner, EP 1346822 A1, Published Sep. 24, 2003, Machine translation of Description in German and English.*

(Continued)

*Primary Examiner* — Alan Cariaso
(74) *Attorney, Agent, or Firm* — Young & Thompson

(57) ABSTRACT

A glass composite has at least one first main glass panel (2), at least one second main glass panel (3) arranged at a distance from the first main glass panel, and at least one plate element (5) arranged between the main glass panels (2, 3), wherein at least one technical module (4) is arranged between the two main glass panels (2, 3) and the plate element (5) borders a recess (6) that is adapted to the shape of the technical module (4), in which recess the technical module (4) is accommodated.

20 Claims, 5 Drawing Sheets

(51) Int. Cl.
*F21V 29/00* (2015.01)
*F21V 33/00* (2006.01)
*F21V 8/00* (2006.01)
*F21V 29/50* (2015.01)
*F21V 29/508* (2015.01)
*F21Y 101/02* (2006.01)
*F21Y 105/00* (2016.01)

(52) U.S. Cl.
CPC ........... *F21V 33/006* (2013.01); *G02B 6/0076* (2013.01); *B32B 2457/00* (2013.01); *B32B 2457/12* (2013.01); *F21V 29/508* (2015.01); *F21Y 2101/02* (2013.01); *F21Y 2105/001* (2013.01)

(56) References Cited

U.S. PATENT DOCUMENTS

| | | | | |
|---|---|---|---|---|
| 7,730,678 B2* | 6/2010 | Czapka | ................ | B44C 5/0407 428/34 |
| 7,817,327 B2* | 10/2010 | Derda | .................... | B32B 17/10 359/265 |
| 7,911,559 B2* | 3/2011 | Ohta | .................... | G02B 6/0055 349/61 |
| 2004/0182432 A1* | 9/2004 | Yoda | ..................... | H01L 31/048 136/244 |
| 2011/0155245 A1* | 6/2011 | Hsiao | ................... | H01L 31/048 136/261 |

FOREIGN PATENT DOCUMENTS

| | | |
|---|---|---|
| DE | 102004059742 A1 | 6/2006 |
| DE | 102006027074 A1 | 9/2007 |
| EP | 0324710 A1 | 7/1989 |
| EP | 1076205 A1 | 2/2001 |
| EP | 1346822 | 9/2003 |
| EP | 1346823 A1 | 9/2003 |
| GB | 2316216 A | 2/1998 |
| WO | 02095287 A1 | 11/2002 |
| WO | 03048494 A1 | 6/2003 |
| WO | 2007077239 | 7/2007 |

OTHER PUBLICATIONS

International Search Report, dated Jul. 3, 2013, from corresponding PCT application.
Chinese Office Action dated Jul. 19, 2016, with English Translation; Application No. 201380026997.1.

* cited by examiner

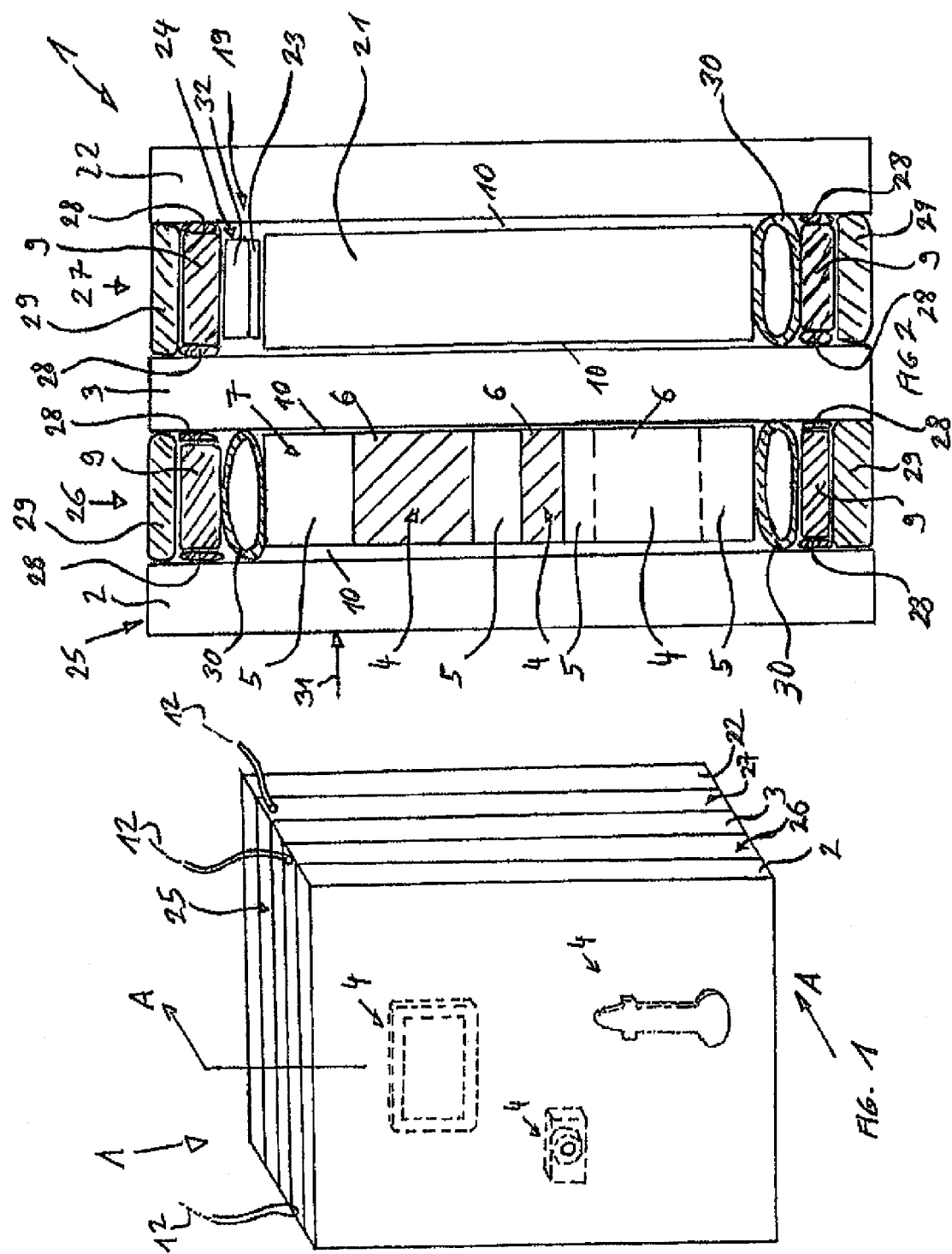

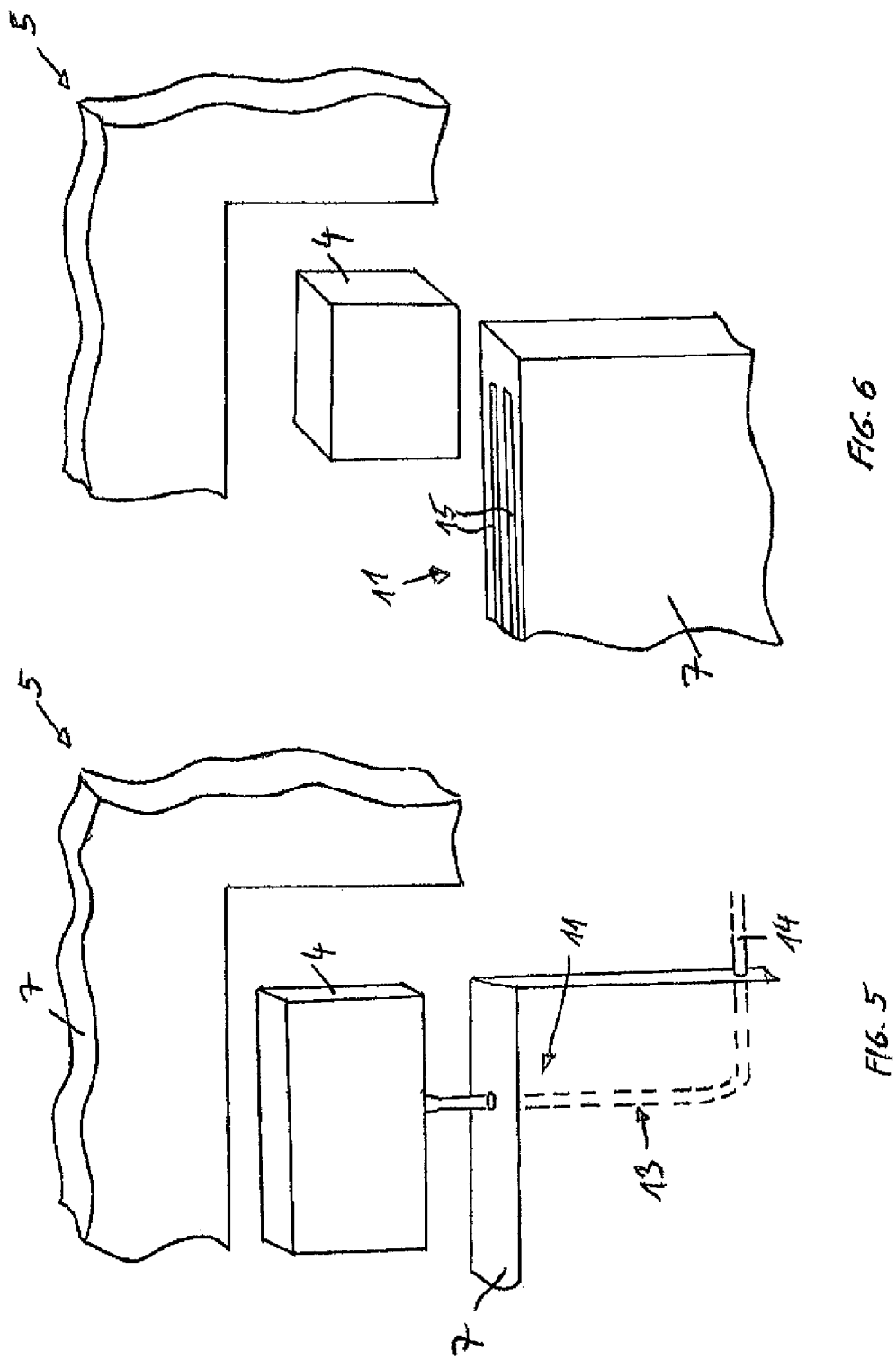

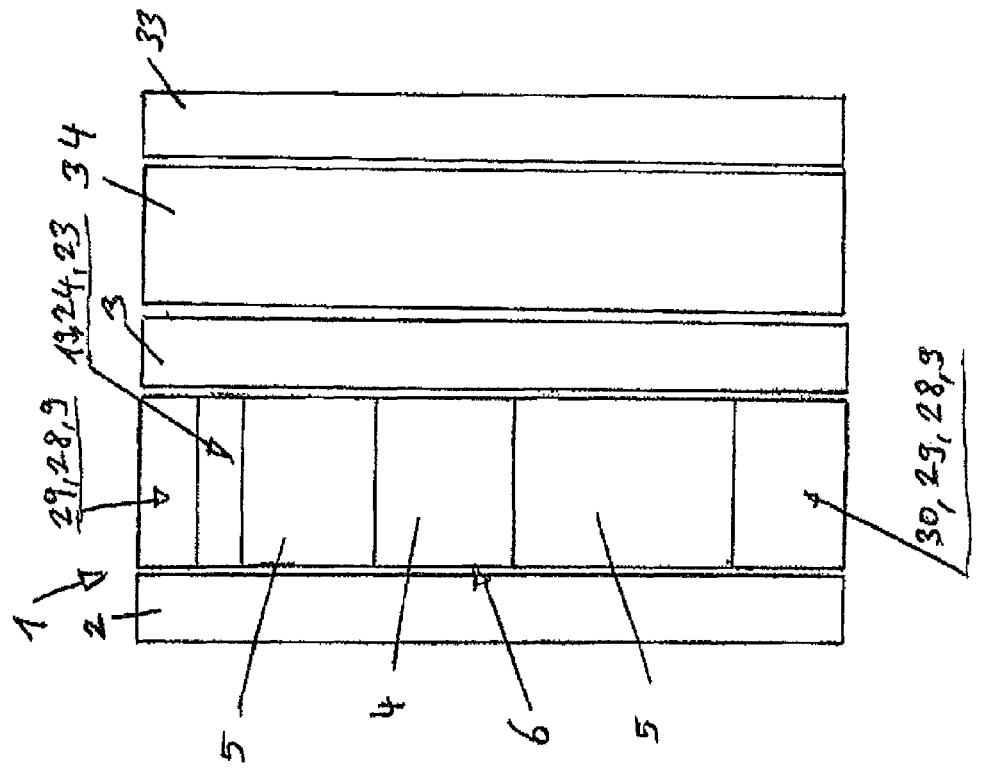
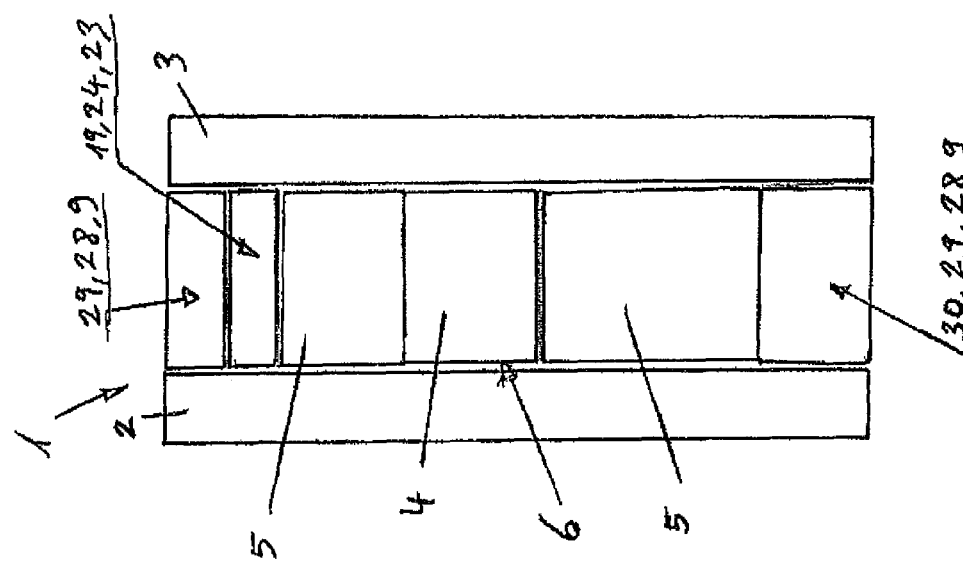

GLASS COMPOSITE WITH FUNCTIONAL ELEMENT

The invention relates to a glass composite with at least one first main glass panel, at least one second main glass panel that is spaced apart from the first, and at least one plate element that is located between the main glass panels.

Moreover, the invention relates to a method for producing such a glass composite.

A generic glass composite is known from WO 2003/048494. The glass composite disclosed there can advantageously be used for architectonic purposes.

The object of the invention is to expand the applications of the known glass composite beyond the pure architectonic use.

This object is achieved, on the one hand, by a glass composite according to claim 1 and, on the other hand, by a method according to claim 11.

Preferred and advantageous embodiments of the invention are the subject matter of the dependent claims.

It is provided according to the invention that at least one technical module is located between the two main glass panels and that the plate element borders or defines at least partially a recess that is matched to the shape of the technical module and in which the technical module is accommodated.

Moreover, it is provided according to the invention that at least one technical module is located in a recess of at least one plate element, which recess is matched to the shape of the technical module, and that the at least one plate element and the at least one technical module are located between the two main glass panels.

The subject matter of the invention is furthermore a use of a glass composite according to the invention as a frame for a technical module.

A technical module is not to be understood as a plate element within the scope of this patent application. Therefore, this module is an element that is different from the plate element.

The measures according to the invention advantageously result in that the technical module or the technical modules are now accommodated or integrated in a dustproof and scratchproof manner in the glass composite. With a glass composite made in this way, not only aesthetically pleasing elements but also functional elements can thus be integrated into the architecture. In doing so, conventional metal frames, screws, rivets and the like that are usually required for local stabilization or positioning of technical or electrical modules and that would adversely affect the aesthetics of the glass composite are completely avoided.

The two main glass panels can implement one front wall and one rear wall of the glass composite. The main glass panels can be produced by all types of glass in technical structures and thicknesses, by transparent and translucent plastics, and so forth.

The plate element is preferably transparent, especially colorless or colored, advantageously the plate element being produced from, for example, transparent or translucent plastic, especially from acrylic glass (for example, PMMA-polymethyl methacrylate). Materials for the plate element, however, can also be metals, minerals, wood, and the like. The plate element is conventionally aligned parallel to the main glass panels and is made roughly the same size as the main glass panels, but especially on the elements in the edge region smaller than the main glass panels. The plate element or plate elements act(s) as retaining disk(s) or frames for the module. The single plate element is—or the plate elements are—located in a plane between the main glass panels. This plane can be understood as a function plane because the module introduces a technical function in the glass composite.

Therefore, within the scope of the invention, it is especially advantageous if the at least one plate element is located between the two main glass panels in one function plane and acts as a frame within this function plane for at least one technical module by its bordering a recess that is matched to the shape of the technical module and in which the technical module is accommodated. At least one technical module is therefore arranged in a recess of at least one plate element located in a function plane, which recess is matched to the shape of the technical module, such that the at least one plate element acts as a frame for the technical module within this function plane and such that the at least one plate element and the at least one technical module are located between the two main glass panels.

Such a plate element can be made in, for example, one or more parts. The entire occupied area of the one-part or multi-part plate element and of the module, which are both located in a plane (function plane) that is parallel to the main glass panels, corresponds roughly to the total area of the glass composite.

In a one-part design, the recess can be defined completely by a hole in the plate element. The recess can, however, also be located on the edge of the plate element and can border, for example, two or three sides of the recess. The remaining sides of the recess can be produced by the edge of the glass composite. In a multi-part design of the plate element, individual plate elements can also be located next to one another in the plane between the main glass panels at least in areas adjoining one another in a flush manner. In this design, the recess can be contained in one of the plate elements, and the plate element or the other plate elements can be free of recesses.

Adjacent plate elements, however, can also have recesses on their edges that point toward one another and that in sum produce the shape of the recess to be defined for the module. The module is inserted exactly into this cutout or this recess in the transition region between the plate elements. In a multi-part design, therefore, both the plate element or the plate elements and also the module are also located in the plane between the main glass panels (function plane).

In the mounted state, the plate element and the technical module can extend from the first main glass panel to the second main glass panel. It is also possible for the plate element to form not only one lateral frame for the technical module, but, if the depth of the technical module is smaller than the distance between the two main glass panels, also to extend over the front and/or back of the technical module.

According to one preferred embodiment, the plate element is made in several parts, i.e., at least in two parts. Along one of the two plate elements or else the two plate elements, the recess in which the module is accommodated is made. The module is therefore located in a boundary region between the at least two plate elements. Therefore, even adjacent plate elements can have recesses on their edges that are adjacent to one another or that point toward one another and that in sum produce the shape of the recess that is to be defined for the module. The number of plate elements can be chosen according to the optical effects that are to be achieved in each case.

It has proven especially advantageous if the plate elements are produced from glass-like panels, hereinafter called frame glass panels, for aesthetic reasons but also for reasons of visual protection technology the frame glass panels having different transparency or else different colors. Thus, for example, sensor functions of the module or modules can be assigned to a less transparent region; conversely, modules or regions of these modules that are used for visualization are assigned to a transparent region.

The module is preferably selected from a group of the following elements: display unit (for example, monitor); input unit, such as buttons or keyboard or the like; sensor unit; photovoltaic panel; current-carrying and/or data-carrying and/or data-recording apparatus, especially a camera. With these elements, many functions of an even autonomously acting glass composite can already be implemented. Using the display unit, information can be communicated to a user or passer-by. Using the input unit, information can be delivered from one such individual. A sensor unit can, for example, detect air pressure or air temperature when it is connected to the vicinity of the glass composite via sensor elements. The power supply of the individual elements can be guaranteed, for example, using an integrated photovoltaic panel so that self-contained operation is possible. It should also be mentioned that there need not be any self-contained function of the glass composite, in such a case the individual elements being connected to the vicinity of the glass composite in the form of wireless or hard-wire information or energy or power transmission. The technical module can be an electronic or mechanical module or a module based on, for example, physical principles, such as, for example, a mercury thermometer or a barometer or an optical lens.

According to another aspect, for the glass composite, at least one of the main glass panels and the module are arranged at a distance to one another by means of a spacer such that cooling of the module is ensured. The spacer guarantees that an air space that is intended for cooling remains between at least one of the main glass panels and the module and/or the plate element. This distance is such that it allows air convection that is intended accordingly for cooling in the operation of the module. If the air space is made only on one side, i.e., is in front of or behind the module, it can thus have a depth of from 5% to 90% of the depth of the module. If two air spaces are made, however— i.e., one in front of and one behind the module—it can have a depth of from 5% to 45% of the depth of the module. In both cases, it is ensured that the module does not fall into the air space. According to this embodiment, there is the advantage that reliable cooling or heat dissipation from the module into the vicinity of the glass composite is ensured.

According to another aspect of the invention, the glass composite has conducting means that are intended for electrically-conductive connection of the electrical terminals of the module to the vicinity of the glass composite. Such conducting means in the plate element can have a hole or notch or groove and an electrical line that is accommodated there and/or can have first printed conductors that run on the edges of the plate element and that are line-like or surface-like there and/or between the main glass panels can have spacers inserted on the edge side that define the distance of the main glass panels to one another, the spacer being a component of the conducting means and having electrically-conductive structures in regions, especially in the form of cable-like, line-like or surface-like second printed conductors, and/or corner elements between the spacers forming a component of the conducting means and having an electrically-conductive penetration in order to electrically connect the module to the vicinity of the glass composite.

The hole, notch, groove or lines that are accommodated therein can be used intentionally for configuration purposes. In order to not adversely affect the visually undegraded character of the plates arranged flat on one another, shapes as unremarkable as possible, such as the indicated line-like or surface-like first printed conductors, can be used, or the material of the plate elements can be opaque (nontransparent). These printed conductors can also be coated with insulating layers and along the edges of the plate element can be laminated next to one another or on top of one another.

In the region of the accommodated module, they end where they make contact with electrical contacts or electrical lines of the module.

Conducting means for signal transmission can, however, also be optical fibers that according to the application are integrated into the respective plate element either optically as inconspicuously as possible or imparting an optical accent or that run on its surface.

According to another aspect of the invention, the spacer is also a component of the conducting means and has a structure that is electrically-conductive in regions, especially in the form of cable-like, line-like or surface-like second printed conductors. These second printed conductors end on those regions in which the first printed conductors of the respective plate element end. There, the second printed conductors are connected to the aforementioned electrical conductors. The spacer can be, for example, a hollow body—for example, a hollow profile rod—and lines can be accommodated in it. The spacer, however, can also be formed by a structure of current-carrying material, such as, for example, [sic] in along its longitudinal extension, two or more metallically conductive parts that are connected to one another by an insulating part are separated so that the spacer itself produces a twin-core or multi-core line. For signal transmission in the spacer, optical fibers can also be integrated that are coupled to the optical fibers in the respective plate element.

The spacers that run along the edges of the glass composite are connected to one another by corner elements on the corners of the glass composite. The tightness of the glass composite also remains ensured by the corner element because it is not the sealing material and other materials of the glass composite that must be penetrated. Accordingly, these corner elements between the spacers are likewise a component of the conducting means and have an electrically-conductive penetration in order to electrically connect the module to the vicinity of the glass composite without endangering the tightness of the glass composite. The electrically-conductive penetration can be implemented using a cable. The cable can end outside of the glass composite in any type of plugs. Preferably, the electrically-conductive penetration is implemented by a plug that is integrated into the corner element and that by means of a cable allows current entry from the outside and thus connects the power-consuming elements located within the spacer and implements their current connection.

According to one preferred embodiment, the glass composite consists of only two main glass panels, and between these main glass panels, there extends a single function plane. In this design, illumination means can be integrated between the two main glass panels and can be provided for lateral feed of light between the main glass panels into one plate edge of the plate element. These illumination means can have so-called fluorescent lamps or also energy-saving lamps. According to one preferred embodiment, the illumination means have one or more light-emitting diodes, especially in the form of a light-emitting diode strip. These illumination means are located on the edge side on the glass composite between the main glass panels and emit light into the regions between the main glass panels. The light is therefore emitted laterally (on the edge side) and emerges two-dimensionally again via the surfaces (front and/or back surface) of the plate element. In a plate element that has been illuminated in this way, the module or modules is/are illuminated with this light. Moreover, this light can be used for space illumination for the vicinity of the glass composite.

According to another embodiment, the glass composite, adjacent to one of the main glass panels, especially the main glass panel that is facing a back of the module, can have an illumination layer that runs in a plane that is parallel to the indicated main glass panels and between the indicated main glass panels, and a third main glass panel has an embedded light-conducting illumination panel. This entails the advantage that the respective illumination glass panels can be completely illuminated. For the case in which the illumination glass panels [sic] is located in front of the module in the direction of viewing, the entire module appears in the respectively chosen color of the light. The color can, however, also be chosen by the color of the illumination glass panel. For the case in which the illumination glass panel is located behind the module, i.e., the module is supported by the illumination glass panel in the direction of viewing, the module appears lighted from the background. The illumination glass panel can illuminate both the region in front of the glass composite and also the region behind the glass composite with a light of the same color.

According to another aspect of the invention, the glass composite, adjacent to one of the main glass panels, especially that main glass panel that is facing a back of the module, has a color layer that runs in a plane that is parallel to the indicated main glass panels, and between the indicated main glass panels and another main glass panel, it has a color panel that is embedded. The additional color panel allows the availability of additional optical functions, such as, for example: visual protection from, for example, the rear, in order to optically hide the module or other elements of the glass composite; protection from the sun; and, when the color plane is illuminated from within the glass composite, color effects can also be achieved with it, such as, for example, behind the glass composite, a light color that is different from that in front of the glass composite. The glass composite consequently has a luminescent pane (lighting panel) that is located toward the retaining pane (main glass panel), the luminescent pane being formed from light-conducting material. The retaining pane is two-dimensionally illuminated by light feeds on at least one edge-side lateral edge of the luminescent pane and a light exit via its surface that faces the retaining pane, between the retaining pane and the luminescent pane there being in two dimensions a spacer material that has an index of refraction that differs from the index of refraction of the color pane (color panel). Due to the illumination capacity achieved in this way, the technical elements or modules in various applications can assume or develop the above-described optical and/or visual functions. The luminescent pane forms over it an illumination body that produces an ambient light that radiates beyond the glass composite, so to speak illuminates the vicinity of the glass composite.

According to another aspect of the invention, the light-emitting diodes, preferably the light-emitting diode strip, are located on the right and/or left and/or upper edge of the glass composite. Thus, direction-dependent light impressions or uniform illumination, i.e., direction-dependent illumination, can be achieved. The individual light-emitting diode strips can also be supplied with current at different times, and thus photodynamic effects can be achieved.

According to another aspect of the invention, the illumination means are thermally coupled to the spacer. The illumination means are located within the spacer relative to the outer edge of the glass composite and produce heat there. The thermal coupling is especially advantageous when the spacers consist of a thermally highly conductive material, especially a metal (for example, aluminum) or an alloy. The thermal coupling of illumination means and spacer produces a cooling body using which the heat that has been generated by the illumination means can be efficiently transported out of the glass composite. The thermal coupling can take place by close contact of the parts with one another, such as, for example, by cementing them to one another or using a heat conductive paste, etc.

For the case in which the illumination means are located in the same plane as the module, the indicated cooling body can also be used to dissipate the heat that is produced by the operation of the module in the glass composite.

It has proven especially advantageous when the spacer is made in the form of a hollow section so that a surface that is as large as possible is available for cooling.

According to a preferred embodiment, the illumination means have a light-emitting diode strip having a board with light-emitting diodes attached to it. The board is used as a cooling body for heat dissipation.

Such a glass composite can be produced as follows. First, the main glass panels are produced and prepared and are framed with corresponding positioning and bordering parts (spacer, corner elements, elastic edge element). The rear main glass panel is placed flat. The respective plate element and the module that has been inserted into the recess are placed on this main glass panel, and the module is connected to the electrical lines (for example, power supply lines). Afterwards, the front main glass panel is placed on the primary seal. Accordingly, at least one glass-like plate element is arranged between two main glass panels, the at least one plate element defining a recess that is matched to the size of the module and the indicated module being arranged in the indicated recess. As already mentioned initially, the plate element can also be made in several parts. In this case, the module can be inserted into the recess that is bordered by two or more plate elements.

Optionally, illumination means can also be accommodated in the glass composite; they are integrated between main glass panels and are made to laterally feed light between the main glass panels. The integration of the illumination means can take place in the plane of the module or in a plane that is adjacent to it. The illumination means as mentioned are thermally coupled to the spacer that is located farther outside relative to the center of the glass composite to achieve the aforementioned effects.

The joined glass composite can now be set up, and the electrical module can be operated. Those elements that encompass the plate element or plate elements together with the module in the manner of a frame are used essentially for three functions, specifically spacing and elastic support, definition of a distance of the plate element from the edges of the glass composite, and tightness of the glass composite. This protects the electrical module from moisture and other ambient effects.

In summary, the invention discloses a technical method by which technical modules such as monitors, displays, and sensors can be inserted into glass and, moreover, their illumination and that of the glass surface can be guaranteed. To do this, according to the invention, plate-shaped, for example acrylic glass, elements are placed in a glass composite; their open spaces can accommodate as required the different technical parts (modules) and their cabling, and, moreover, form a holder for these technical parts. By the integration of luminous means, these plate elements that are accommodated in the glass composite and their integrated modules can be illuminated. The technical modules that have been integrated into the glass composite in this way appear as if they were simply only floating in the glass, held without any mountings. The position, location and orientation of the modules can be very exactly defined due to the precise workability of the plate elements or of the plate element. The expected heat development in operation is taken into account by a corresponding distance to the glass plates. Moreover, the heat dissipation from the luminous means, such as, for example, the light-emitting diodes, is routed to the outside from the interior of the glass composite by a specially devised board (print board) via the spacer that is thermally coupled to the board.

The special arrangement of the modules in the recess of the plate element enables fitted accommodation of the technical modules and fixes the latter in a reliable manner. With respect to the power and data transmission cable, it should be mentioned that the latter can be integrated optically barely perceptibly in the glass composite not only via conventional cables, but by specially configured, almost invisible lines or materials.

Features of the method can be further developed according to the features of the device. The advantages that were named in conjunction with the device are considered as also applied to the method.

Additional details, features and advantages of the invention will become apparent from the following description with reference to the attached drawings in which preferred embodiments are shown.

Here:

FIG. 1 shows a glass composite according to a first embodiment of the invention;

FIG. 2 shows a sectional view through the glass composite according to FIG. 1;

FIG. 5 shows conducting means according to a first embodiment;

FIG. 6 shows conducting means according to a second embodiment;

FIGS. 8-9 show other embodiments of the invention.

Figure 4:
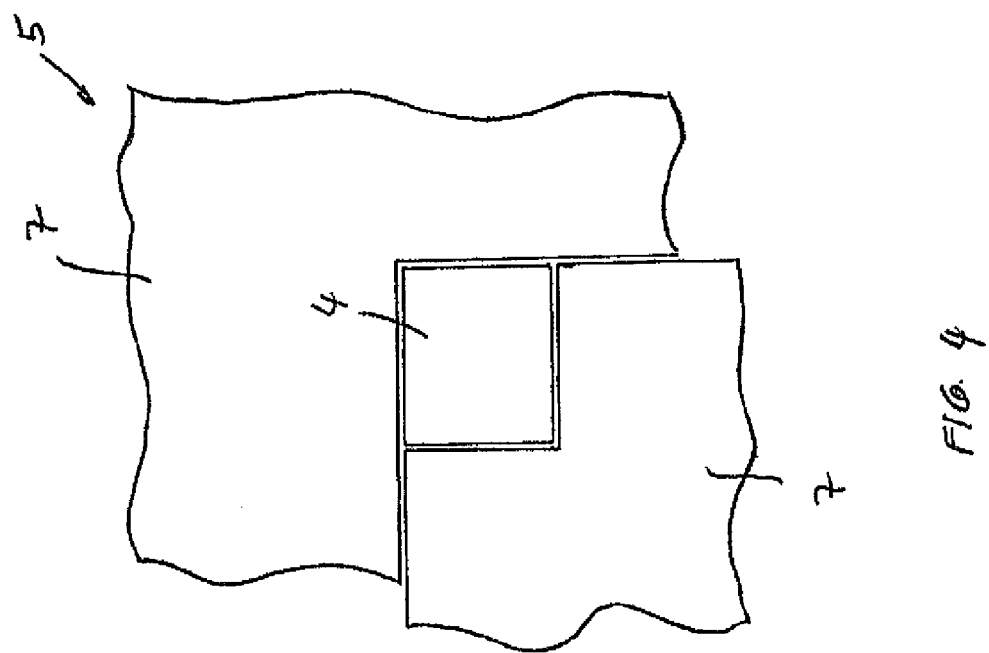
FIG. 4 shows the elements according to FIG. 3 in the assembled state.

FIG. 1 shows a glass composite 1 that has a first main glass panel 2 as a front pane and a second main glass panel 3 as a central pane. Between the first and the second main glass panels 2, 3, there is a function plane or module layer 26. In this module layer 26, four different modules 4 are integrated, such as, for example, the uppermost as a display element, the two middle ones as an input unit, and the one that is located at bottom right as a sensor unit. Behind the second main glass panel 3, there are an illumination layer 27 and a third main glass panel 22 that adjoins parallel thereto as the rear wall. The illumination layer 27 is used for back illumination of the module layer 26 or the modules 4 accommodated in it. The module layer 26 as well as the illumination layer 27 in the region of their corners are provided with electrical connections 12 that in this case are made as cables.

FIG. 2 shows a sectional view along the cutting plane A-A that is shown in FIG. 1 and in which further details of the glass composite 1 are visible. An arrow 31 shows one direction of looking at the glass composite 1. Between the three main glass panels 2, 3, 22, at least two upper modules 4 are shown in their cross-section in the cutting plane A-A. It can also be clearly seen that the plate element 5 has a recess 6 that is matched to the shape of the respective module 4 and in which the module 4 is accommodated.

In this case, the plate element 5 is formed by a single frame glass panel 7 that has recesses 6 that are matched according to the number of modules 4. Between the main glass panels 2, 3, 22, on the edge side, spacers 9 are inserted that define the distance of the main glass panels 2, 3, 22 to one another such that a gap 10 forms between the main glass panels 2, 3, 22 and the module 4 as well as the plate element 5, so that the heat development that can be expected in the module 4 can be dissipated via the air between the module 4 and the plate element 5, on the one hand, and the respective main glass panel 2, 3, 22, on the other hand. The spacer 9 is for its part embedded in a primary seal 28 in the direction of the main glass panels 2, 3, 22. Outside of the spacer 9, there is a secondary seal 29 that on its outer side ends flush with the outer edge of the main glass panels 2, 3, 22. Within the spacer 9, at least in the function plane of the modules 4, i.e., the module layer 26, there is an elastic edge element 30, which surrounds essentially completely the plate element 5 on the peripheral side, in the form of silicone tubing.

The indicated spacer 9 is also embedded in the indicated primary seal 28 in the illumination layer 27. Likewise, outside of the spacer 9, there is the indicated secondary seal 29. In contrast to the module layer 26 in which the elastic edge element 30 surrounds the entire periphery, in the illumination layer 27, the elastic edge element 30 is only made on the left, right and lower edges. On the upper edge, between an illumination panel or illumination glass panel 21 and the upper spacer 9, there is a light-emitting diode strip 24 having a number of light-emitting diodes 23. The illumination panel 21 together with the light-emitting diode strip 24 produces components of illumination means 19 that are used to illuminate the module layer 26 and the modules 4 that are accommodated in the module layer 26. In this case, the illumination means 19 are embedded between the second main glass panel 3 and the third main glass panel 22. The light-emitting diodes 23 of the light-emitting diode strip 24 are located on the edge side on the glass composite 1 between the second main glass panel 3 and the third main glass panel 22 and emit light into the regions between the main glass panels 3 and 22 that propagates along the illumination panel 21. The light emerges from the illumination panel 21 via its front side that faces the modules 4 and thus illuminates the modules 4 from the rear and shimmers through between them. The light emerges from the illumination panel 21 via its back that is oriented parallel to the indicated front and illuminates there the space located behind the glass composite 1.

Figure 3:
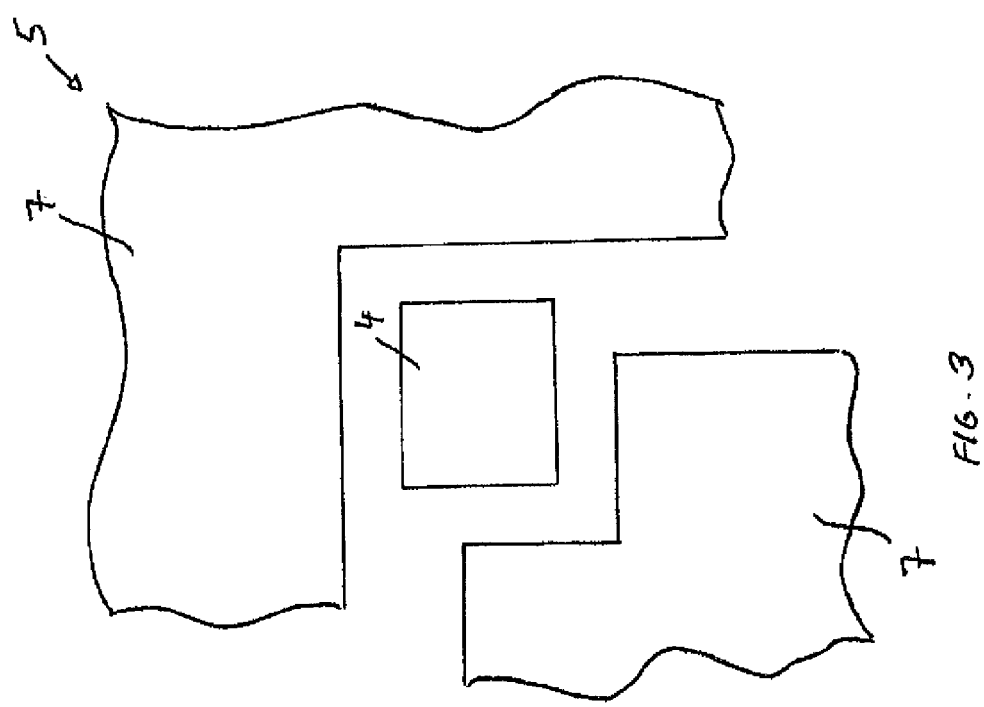
FIG. 3 shows a module and two frame glass panels that are intended for accommodation of the module, detached from one another.

FIG. 3 shows a plate element 5 according to another embodiment of the invention. This plate element 5 has two frame glass panels 7. In this case, the left lower frame glass panel 7 has a recess in a shape that makes it possible to completely accommodate or surround the module 4 on its left and lower edge. In the assembled state, the three elements, specifically the two frame glass panels 7 and the module 4, are arranged as shown in FIG. 4. For reasons of clarity, FIG. 4 shows intermediate spaces between the elements 5 and 7 that in reality do not occur to this extent or at all due to the fitted matching of the recesses of the individual frame glass panels 7 to the contour of the module 4. For an observer of a real implementation, it appears as if the elements would pass seamlessly into one another.

FIG. 5 shows a configuration that is similar to FIG. 3 in an oblique view. In this case, the focus is on the conducting means 11 that are made in the frame glass panel 7 that is located at the bottom left in the form of a hole 13 with an electrical line 14 that is accommodated in it, the line 14 being connected to the module 4 in an electrically-conductive manner. The electrical line 14 is separably connected to the module 4 in a fixed manner or using plug connections that are not shown.

FIG. 6 discloses another embodiment for the conducting means 11 that in this case are made on edges of the frame glass panel 7 located at the bottom left in the form of line-like or surface-like first printed conductors 15. The conducting means 11 make contact by attachment of the module 4.

The circumstance that the spacer is a component of the conducting means 11 and in regions has electrically-conductive structures, especially in the form of cable-like, line-like or surface-like second printed conductors 16 that are connected to the first printed conductors 15 in an electrically-conductive manner, is not shown in detail.

Figure 7:
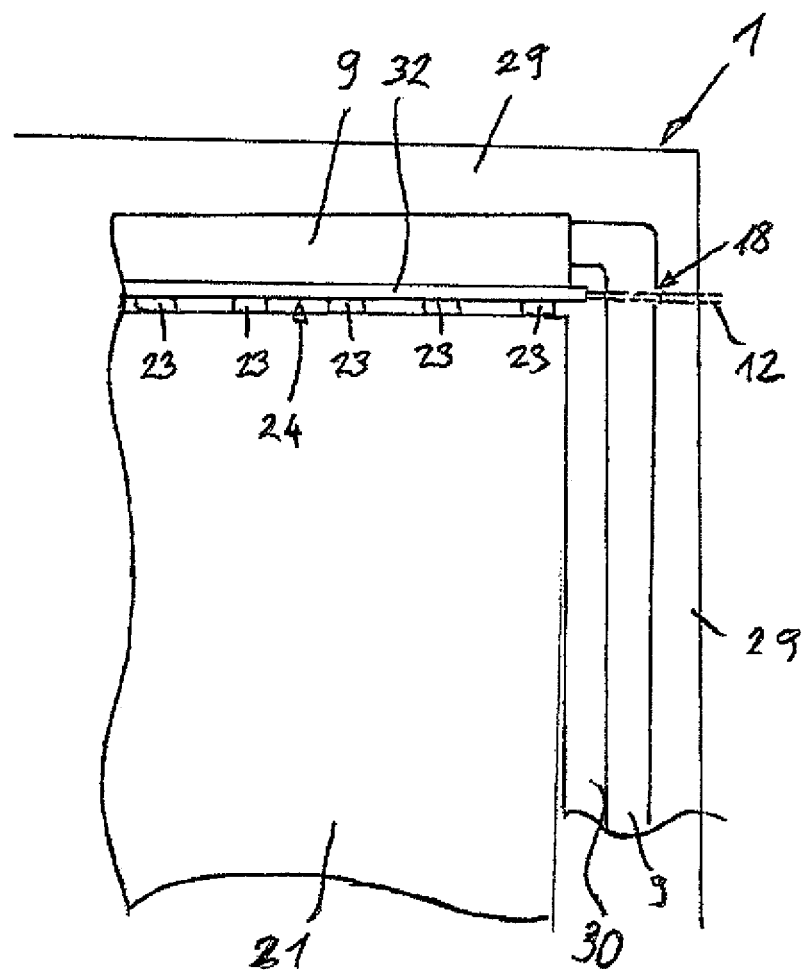
FIG. 7 shows a detail of the glass composite according to FIG. 1 with illumination means.

FIG. 7 shows a detail of the region of the illumination layer 27 that is located at the top right. There, illumination means 19 are visualized that are produced by a light-emitting diode strip 24 having a number of light-emitting diodes 23 attached to a board 32. The board 32 is thermally coupled to the spacer 9. Between adjacent spacers 9, a corner element 17 that connects them is shown. The corner element 17 has a penetration 18 into which a cable is inserted as an electrical connection 12, with which the light-emitting diode strip 24 is connected to the vicinity of the glass composite 1.

FIG. 8 shows a glass composite 1 with a single plane between the main glass panels 2 and 3, here also the illumination function being integrated into the upper part.

In FIG. 9, in the direction of the back of the module 4, a fourth main glass panel 33 and—between the main glass panels 3 and 33—a color panel 34 are integrated. With their aid, the back of the glass composite 1 appears in a color of light that is different from that of the front.

Finally, it is pointed out one more time that the figures that were described in detail above are only embodiments that can be modified by one skilled in the art in the most varied ways without departing from the field of the invention. For the sake of completeness, it is also pointed out that the use of the indefinite articles "a" or "an" does not preclude that the pertinent features can also be present repeatedly.

REFERENCE NUMBER LIST

1 glass composite
2 first main glass panel
3 second main glass panel
4 module
5 plate element
6 recess
7 frame glass panel
8 not used
9 spacer
10 gap (distance)
11 conducting means
12 electrical connections
13 hole, notch, groove, etc. (viewing direction)
14 line
15 first printed conductors
16 second printed conductors
17 corner elements
18 penetration
19 illumination means
20 not used
21 illumination panel
22 third main glass panel
23 light-emitting diode
24 light-emitting diode strip
25 not used
26 module layer
27 illumination layer
28 primary seal
29 secondary seal
30 elastic edge element
31 arrow
32 board
33 (additional) fourth main glass panel
34 color panel

The invention claimed is:

1. Glass composite with at least one first main glass panel (2), at least one second main glass panel (3) that is spaced apart from the first main glass panel, and at least one plate element (5) that is located between the first and the second main glass panels (2, 3), and at least one technical module (4) located between the first and second main glass panels (2, 3), wherein the plate element (5) borders a recess (6) that is matched to the shape of the technical module (4), in which recess the technical module (4) is accommodated, and wherein illumination means (19) are integrated between the first and the second main glass panels and the illumination means (19) are designed for lateral feed of light between the first and the second main glass panels.

2. Glass composite according to claim 1, wherein the plate element (5) is made at least in two parts and wherein the at least two parts in the plane between the main glass panels (2, 3) adjoin the edges of the technical module (4).

3. Glass composite according to claim 1, wherein the technical module (4) has at least one of the group consisting of a display unit, an input unit, a sensor unit, a photovoltaic panel, a current-carrying apparatus, data-carrying apparatus, a data-recording apparatus.

4. Glass composite according to claim 1, wherein at least one of the main glass panels (2, 3) and the technical module (4) are arranged at a distance to one another using a spacer (9) such that cooling of the technical module (4) is ensured.

5. Glass composite according to claim 1, wherein adjacent to one of the main glass panels (2, 3), especially the main glass panel (3) that is facing a back of the technical module (4), there is an illumination system that runs in a plane parallel to these main glass panels (2, 3) and between these main glass panels (2, 3), and a third main glass panel (22) has an embedded light-conducting illumination panel (21).

6. Glass composite according to claim 1, wherein adjacent to one of the main glass panels (2, 3, 22), especially the main glass panel (3, 22) that is facing a back of the technical module (4), there is a color layer that runs in a plane that is parallel to these main glass panels (2, 3, 22) and between these main glass panels (2, 3, 22), and another main glass panel (33) has a color panel (34) that is embedded.

7. Glass composite according to claim 1, wherein there are conducting means (11) that are intended for electrically-conductive connection of electrical terminals (12) of the technical module (4) to the vicinity of the glass composite (1), and at least one of the group consisting of
i) the conducting means (11) in the plate element (5) having a hole or notch or groove (13) and an electrical line (14) that is accommodated there,
ii) the conducting means (11) having first printed conductors (15) that run on the edges of the plate element (5) and that are line-like or surface-like there, and
iii) between the main glass panels (2, 3), spacers (9) being inserted on the edge side that define the distance of the main glass panels (2, 3) to one another, the spacer (9) being a component of the conducting means (11) and having electrically-conductive structures in regions, in the form of at least one of the group consisting of i) cable-like, line-like or surface-like second printed conductors (16), and ii) corner elements (17) between the spacers (9) forming a component of the conducting means (11) and having an electrically-conductive penetration (18) in order to electrically connect the technical module (4) to the vicinity of the glass composite (1).

8. Glass composite according to claim 1, wherein the illumination means (19) are thermally coupled to a spacer (9).

9. Glass composite according to claim 8, wherein the illumination means (19) have a light-emitting diode strip (24) having a board (32) with light-emitting diodes (23) attached to it and wherein the board (32) is used as a cooling body.

10. Glass composite according to claim 1, wherein the at least one plate element (5) is located between the two main glass panels (2, 3) in one function plane and acts as a frame in this function plane for the at least one technical module (4) by its bordering a recess (6) that is matched to the shape of the technical module (4) and in which the technical module (4) is accommodated.

11. Method for producing a glass composite (1) with at least one first main glass panel (2), at least one second main glass panel (3) that is spaced apart from the first, and at least one plate element (5) that is located between the first and the second main glass panels (2, 3), wherein at least one technical module (4) is located in a recess (6) of at least one plate element (5), which recess is matched to the shape of the technical module (4), and wherein the at least one plate element (5) and the at least one technical module (4) are located between the two main glass panels, wherein illumination means (19) are integrated between the first and the second main glass panels and the illumination means (19) are designed for lateral feed of light between the first and the second main glass panels.

12. Method according to claim 11, wherein the plate element (5) is made at least in two parts and the parts of the plate element (5) during arrangement are aligned such that in the plane between the main glass panels (2, 3), edges of the technical module (4) adjoin the plate edges of the parts of the plate element (5).

13. Method according to claim 11, wherein between the main glass panels (2, 3) on the edge side, spacers (9) are inserted so that at least one of the main glass panels (2, 3) and the technical module (4) are arranged at a distance to one another using the spacers (9) such that cooling of the technical module (4) is ensured.

14. Method according to claim 11, wherein adjacent to one of the main glass panels (2, 3), especially the main glass panel (3) that is facing a back of the technical module (4), there is an illumination system that runs in a plane that is parallel to these main glass panels (2, 3) and between these main glass panels (2, 3), and a third main glass panel (22) has an embedded light-conducting illumination panel (21).

15. Method according to claim 11, wherein adjacent to one of the main glass panels (2, 3, 22), especially the main glass panel (3, 22) that is facing a back of the technical module (4), there is a color layer that runs in a plane that is parallel to these main glass panels (2, 3, 22) and between these main glass panels (2, 3, 22), and another main glass panel (33) has a color panel (34) that is embedded.

16. Method according to claim 11, wherein the illumination means (19) are thermally coupled to a spacer (9).

17. Method according to claim 11, wherein the at least one technical module (4) is located in a recess (6) of at least one plate element (5) located in one function plane, which recess is matched to the shape of the technical module (4), such that the at least one plate element (5) acts as a frame for the technical module (4) in this function plane, and such that the at least one plate element (5) and the at least one technical module (4) are located between the two main glass panels (2, 3).

18. Method according to claim 12, wherein between the main glass panels (2, 3) on the edge side, spacers (9) are inserted so that at least one of the main glass panels (2, 3) and the technical module (4) are arranged at a distance to one another using the spacers (9) such that cooling of the technical module (4) is ensured.

19. Glass composite according to claim 2, wherein the technical module (4) has at least one of the group consisting of a display unit, an input unit, a sensor unit, a photovoltaic panel, a current-carrying apparatus, data-carrying apparatus, and a data-recording apparatus.

20. Glass composite according to claim 1, wherein,
there are conducting means (11) that are intended for electrically-conductive connection of electrical terminals (12) of the technical module (4) to the vicinity of the glass composite (1), and
at least one of the group consisting of
i) the conducting means (11) in the plate element (5) having a hole or notch or groove (13) and an electrical line (14) that is accommodated there,
ii) the conducting means (11) having first printed conductors (15) that run on the edges of the plate element (5) and that are line-like or surface-like there, and
iii) between the main glass panels (2, 3), spacers (9) being inserted on the edge side that define the distance of the main glass panels (2, 3) to one another, the spacer (9) being a component of the conducting means (11) and having electrically-conductive structures in regions.

* * * * *